US011424362B2

(12) United States Patent
Ando et al.

(10) Patent No.: US 11,424,362 B2
(45) Date of Patent: Aug. 23, 2022

(54) NCFETS WITH COMPLIMENTARY CAPACITANCE MATCHING USING STACKED N-TYPE AND P-TYPE NANOSHEETS

(71) Applicant: International Business Machines Corporation, Armonk, NY (US)

(72) Inventors: Takashi Ando, Eastchester, NY (US); Reinaldo Vega, Mahopac, NY (US); Cheng Chi, Jersey City, NJ (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/118,752

(22) Filed: Dec. 11, 2020

(65) Prior Publication Data

US 2022/0190167 A1 Jun. 16, 2022

(51) Int. Cl.
*H01L 29/78* (2006.01)
*H01L 27/092* (2006.01)
*H01L 27/07* (2006.01)
*H01L 29/66* (2006.01)

(52) U.S. Cl.
CPC .... *H01L 29/78391* (2014.09); *H01L 27/0711* (2013.01); *H01L 27/092* (2013.01); *H01L 29/6684* (2013.01)

(58) Field of Classification Search
None
See application file for complete search history.

(56) References Cited

U.S. PATENT DOCUMENTS

| | | |
|---|---|---|
| 6,943,633 B2 | 9/2005 | Singh |
| 9,679,893 B2 | 6/2017 | Yan et al. |
| 9,837,414 B1 | 12/2017 | Balakrishnan et al. |
| 10,546,925 B2 | 1/2020 | Reznicek et al. |
| 2015/0021699 A1 | 1/2015 | Ando et al. |
| 2017/0162702 A1 | 6/2017 | Hu |
| 2017/0207225 A1 | 7/2017 | Mueller et al. |
| 2019/0131394 A1 | 5/2019 | Reznicek |
| 2019/0148376 A1 | 5/2019 | Chanemougame |
| 2019/0172755 A1 | 6/2019 | Smith et al. |
| 2020/0127111 A1* | 4/2020 | Lin .................. H01L 29/66795 |

(Continued)

OTHER PUBLICATIONS

Ota et al., "Perspective of negative capacitance FinFETs investigated by transient TCAD simulation," International Electron Devices Meeting (IEDM), 2017, 15.2, 4 pages.

(Continued)

*Primary Examiner* — Xiaoming Liu
(74) *Attorney, Agent, or Firm* — Jeffrey M. Ingalls

(57) ABSTRACT

A negative capacitance field effect transistor (NCFET) device is provided. The NCFET device includes a substrate, and a transistor stack structure formed on the substrate. The nanosheet stack structure includes a PFET region and an NFET region, the PFET region including a pWF metal layer stack and the NFET region including a nWF metal layer stack. The NCFET device also includes a dielectric interfacial layer formed on the transistor stack structure, the dielectric interfacial layer including metal induced oxygen vacancies, and the dielectric interfacial layer formed on a portion of the transistor stack structure. The NCFET device also includes a top electrode formed on the dielectric interfacial layer.

20 Claims, 15 Drawing Sheets

(56) References Cited

U.S. PATENT DOCUMENTS

2020/0303208 A1    9/2020  Xu
2021/0184000 A1*   6/2021  Ramaswamy .. H01L 21/823842

OTHER PUBLICATIONS

Anonymous, Method and Structure for Fabricating Negative Capacitance Field Effect Transistor (NCFET) with Daisy Chained Ferroelectric/Dielectric Stacks and Complementary Logic with Shared Ferroelectric Capacitor, IP.com No. IPCOM000259733D, IP.com Electronic Publication Date: Sep. 11, 2019, 6 pages.

Amrouch et al., "Negative capacitance transistor to address the fundamental limitations in technology scaling Processor performance," IEEE Access, vol. 6, 2018, 12 pages.

International Search Report and Written Opinion for Application PCT/EP2021/084258, dated Mar. 18, 2022, 17 pages.

Shiraishi et al., "Oxygen Vacancy Induced Substantial Threshold Voltage Shifts n the Hf-based High-K MISFET with p+poly-Si Gates—A Theoretical Approach," Japanese Journal of Applied Physics, 2004, pp. L1413-L1415, vol. 43, No. 11A.

* cited by examiner

NCFETS WITH COMPLIMENTARY CAPACITANCE MATCHING USING STACKED N-TYPE AND P-TYPE NANOSHEETS

BACKGROUND

The present disclosure relates to fabrication methods and resulting structures for semiconductor devices. More specifically, the present disclosure relates to fabrication methods and resulting structures for negative capacitance field effect transistors (NCFETs) having complimentary capacitance matching using stacked n-type and p-type nanosheets.

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased. Nanosheets generally refer to two-dimensional nanostructures with a thickness range on the order of about 1 nanometer (nm) to about 100 nm, and they can facilitate the fabrication of non-planar semiconductor devices having a reduced footprint compared to conventional planar-type semiconductor devices. For example, nanosheet transistors, in contrast to conventional planar FETs, include a gate stack that wraps around the full perimeter of multiple stacked nanosheet channel regions for a reduced device footprint and improved control of channel current flow. Accordingly, nanosheets and nanowires are seen as feasible options for reducing the footprints of semiconductor transistor devices to 7 nanometers or less.

The negative capacitance field effect transistor (NCFET) is an emerging technology which is an evolution of a regular FinFET device that is compatible with existing Complementary Metal Oxide Semiconductor (CMOS) fabrication techniques. An NCFET includes a ferroelectric (FE) layer within the gate stack of a transistor, which acts under certain conditions as a negative capacitance to overcome the fundamental limit of sub-threshold swing (SS) in transistors. The latter results in an internal voltage amplification, which allows the transistor to have a larger gain without the need to increase the operating voltage. It may be desirable to incorporate nanosheet structures in NCFET devices to reduce the device footprint.

SUMMARY

Embodiments of the present disclosure relate to a method of manufacturing a negative capacitance nanosheet field effect transistor (NCFET) device. In particular, certain embodiments include a negative capacitance field effect transistor (NCFET) device. The NCFET device includes a substrate, and a transistor stack structure formed on the substrate. The nanosheet stack structure includes a PFET region and an NFET region, the PFET region including a pWF metal layer stack and the NFET region including a nWF metal layer stack. The NCFET device also includes a dielectric interfacial layer formed on the transistor stack structure, the dielectric interfacial layer including metal induced oxygen vacancies, and the dielectric interfacial layer formed on a portion of the transistor stack structure. The NCFET device also includes a top electrode formed on the dielectric interfacial layer.

Other embodiments relate to a method of forming a negative capacitance field effect transistor (NCFET) device. The method includes forming a transistor stack structure including a PFET region and an NFET region, the PFET region including a pWF metal layer stack and the NFET region including a nWF metal layer stack. The method also includes forming a dielectric interfacial layer on the transistor stack structure, the dielectric interfacial layer including metal induced oxygen vacancies and is formed on a portion of the transistor stack structure. The method also includes forming a top electrode on the dielectric interfacial layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
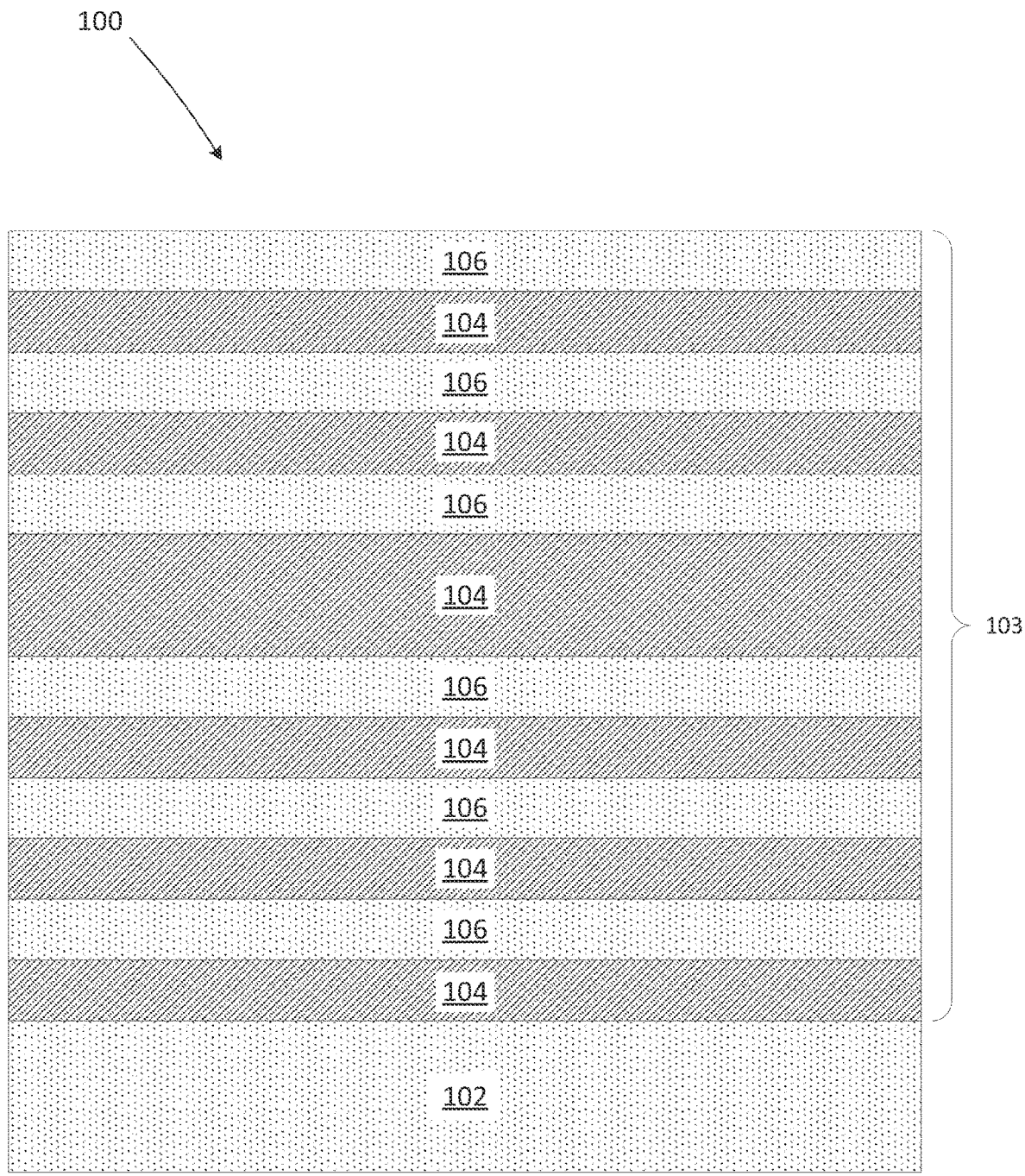
FIG. 1 is a cross-sectional view of a semiconductor nanosheet NCFET device at an intermediate stage of a semiconductor fabrication process flow, according to embodiments.

The present disclosure describes nanosheet NCFET devices and methods of manufacturing the NCFET devices. In particular, the present disclosure describes nanosheet NCFET devices that exhibit complimentary capacitance matching by using stacked n-type and p-type nanosheets.

The flowcharts and cross-sectional diagrams in the Figures illustrate methods of manufacturing nanosheet NCFET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, semiconductor nanosheet devices typically include one or more suspended nanosheets that serve as the channel. An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. As fabrication trends aim to continue reducing the footprints of semiconductor devices, the total contact area between the upper surface of the source/drain epitaxy structure and the lower surface of the metal source/drain contact is reduced.

In general, an NCFET device is similar to a normal transistor except for the replacement of a high-κ dielectric layer with a ferroelectric layer. Alternatively, in certain of the present embodiments, the high-κ layer in related transistor technologies may be retained, with the addition of a ferroelectric layer on the high-κ layer. In one example, when a ferroelectric layer is in series with a dielectric layer, if it is operated within a certain regime, and if the thicknesses of the two layers are matched appropriately, the transistor device may exhibit what is commonly referred to as a negative capacitance effect. With regard to the ferroelectric switching between different polarization states of the device (i.e., it can be polarized to a positive charge or a negative charge), there may be exhibited a hysteresis loop in charge versus the applied field. If the ferroelectric layer is put in electrical series with the dielectric layer, it may be possible to access a region that is in the middle of the hysteresis loop where there is a negative slope. The negative slope region of the device exhibits the negative capacitance effect of the NCFET device. Moreover, if the negative slope of the ferroelectric layer matches closely enough with the slope of the dielectric capacitance, then a high voltage gain may be achieved. If this dual layered structure of the ferroelectric layer and the dielectric layer is incorporated in a transistor, very steep switching may be achieved under certain conditions. One criteria that defines an NCFET device is that the absolute value of the negative capacitance slope of the ferroelectric layer should be higher than the capacitance of the dielectric layer that is in series with the ferroelectric layer.

In certain of the present embodiments, one feature of the NCFET devices is the concept of combining an NFET and a PFET with a shared internal gate. With this configuration, a circuit diagram of the NCFET device shows that the NFET and PFET capacitors are in parallel with each other, and the combination of the NFET and PFET capacitors are in series with the ferroelectric capacitor. As a result, there may be good matching across the entire voltage sweep (i.e., across the Vin sweep). In other words, the NCFET device has a complementary logic circuit (e.g., inverter, NAND, NOR, AIO, etc.) with all gates for a given input sharing a common ferroelectric (FE) capacitor. Thus, an effect of complimentary capacitance matching may be achieved over the entire Vin sweep (i.e., even if the NFET is off, the PFET will be on). The fact that the PFET is on will reduce the NFET subthreshold swing. Similarly, as the NFET turns on, this allows for capacitance matching when the PFET turns off.

The complimentary capacitance matching described above may improve the subthreshold swing in NCFET CMOS devices. However, it generally requires a shared internal metal gate (IMG) between the NFET and PFET (Metal-Ferroelectric-Metal-Insulator-Semiconductor (MF-MIS)), and a shared workfunction metal between the NFET and PFET at the internal metal gate (also shared workfunction at the external gate electrode, typically the gate metal fill). These two requirements generally result in only one threshold voltage (Vt) pair. This may lead to a high N/P Vt with a midgap of the WFM of about 4.6 eV. Moreover, this may reduce the capacitance matching, leading to less SS improvement than may be possible with a theoretical low Vt pair. Regardless of the Vt pairing, there is a requirement for a pair of NFET and PFET stacks (i.e., which comes with a penalty in footprint area compared with conventional NCFET devices).

However, in the present embodiments, the footprint of the NCFET devices may be reduced by stacking n-type and p-type nanosheets on top of each other. Moreover, by including a dielectric interfacial layer having metal induced oxygen vacancies (i.e., rather than in the metal work function layer itself) a structure may be provided with steep swing (SS), with complementary capacitance matching, and with low Vt FET pairs. Moreover, such devices may be provided with a footprint area of only one FET due to the vertical stacking of the n-type and p-type nanosheets. Thus, the stacked configuration of PFET on NFET of the present embodiments is able to achieve an improvement in device performance without the footprint (layout area) penalties that it would typically take to make a transistor switch more steeply.

Figure 14:
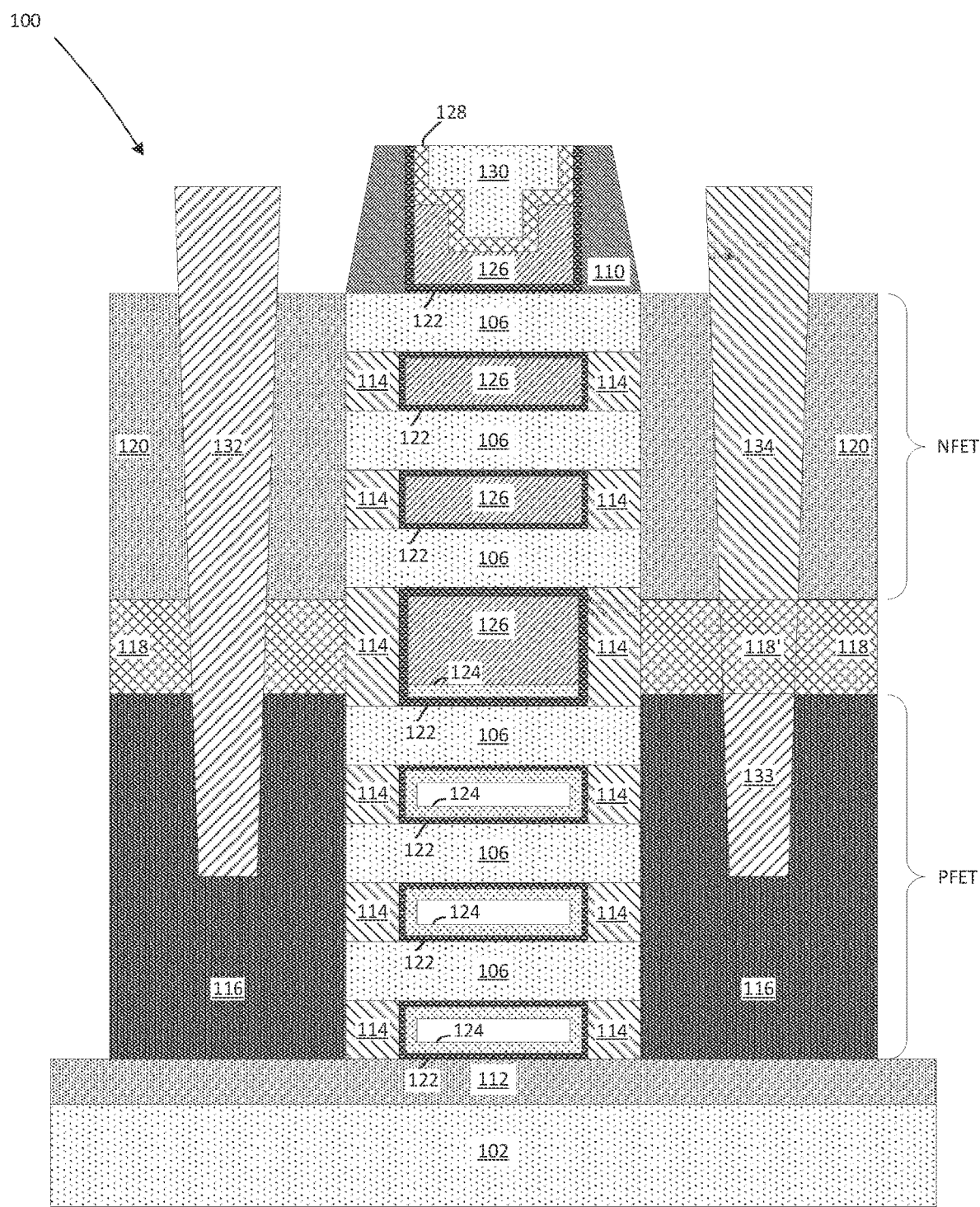
FIG. 14 is a cross-sectional view of the semiconductor nanosheet NCFET device of FIG. 13 after additional fabrication operations, according to embodiments.

One aspect related to the complimentary capacitance matching (CCM) is that the voltage threshold (Vt) pair will determine how much CCM is achieved. For example, as shown in FIG. 14, a high Vt pair has less CCM over the entire voltage sweep and has a less steep swing (SS). On the contrary, a low Vt pair has greater CCM over the entire voltage sweep and has a much steeper SS. The present embodiments provide stacked n-type and p-type nanosheet FETs with dual work function setting metals that achieve low Vt pairs.

It should be appreciated that if the shared internal metal gate does not have the same metal work function for the NFET and the PFET, then the apparent work function (which may be considered to be the average of the two work functions) will be different. For example, if there is a TiN material for the PFET work function metal and an aluminum carbide material for the NFET work function metal, they will inherently have different work functions due to the different materials. As such, the ferroelectric layer (discussed in further detail below) will experience the average of the two work functions for the NFET and PFET (i.e., the apparent work function). Consequently, in this example, there may no longer be what looks like a low Vt pair because the work functions are averaged. However, in the present embodiments, in order to achieve the low Vt pair, the work function should be the same for the whole shared internal metal gate across the NFET and PFET. To achieve this, in certain embodiments as discussed in detail below, the NFET work function metal is not modified, but the dielectric interfacial layer is modified using oxygen vacancies so that the threshold voltage can be tuned to achieve a low Vt pair. In this regard, in certain embodiments, the Vt is set by metal induced oxygen vacancy creation in the dielectric layer rather than in the work function setting metals themselves (e.g., an Al containing alloy for the NFET, and TiN for the PFET). In the present embodiments, the top portion of the replacement metal gate (RMG) stack is recessed and a metal-ferroelectric-metal (MFM) stack is formed in the cavity. In certain embodiments, this structure (i.e., including the oxygen vacancies in the dielectric interfacial layer) enables a steep SS with the CCM and low Vt FET pairs. This structure may also enable a smaller footprint of the FET device due to the stacked NFET and PFET nanosheets.

Referring now to the drawings in which like numerals represent the same or similar elements and initially to FIG. 1, a cross-sectional view of negative capacitance field effect transistor (NCFET) device 100 including a semiconductor nanosheet is shown at an intermediate stage of the manufacturing process. As shown in FIG. 1, a substrate 102 is provided. The substrate may be a silicon based substrate, or any other suitable material. In certain embodiments, a multi-layer nanosheet stack 103 is formed on the substrate 102.

The nanosheet stack 103 includes a sacrificial layer 104, followed by the formation of an active semiconductor layer 106. In certain examples, the first one of the sacrificial layers 104 is formed directly on an upper surface of the substrate 102. In other examples, certain layers may be formed between the upper surface of the substrate 102 and the first one of the sacrificial layers 104. In an example, the sacrificial layer 104 is composed of 35% silicon-germanium (SiGe35). Next, an active semiconductor layer 106 is formed on an upper surface of the first one of the sacrificial layers 104. In an example, the active semiconductor layer 106 is composed of silicon. Several additional layers of the sacrificial layer 104 and the active semiconductor layer 106 are alternately formed. In the example illustrated in FIG. 1, there are a total of six sacrificial layers 104 and six active semiconductor layers 106 that are alternately formed to form the nanosheet stack 103. However, it should be appreciated that any suitable number of alternating layers may be formed.

In certain embodiments, the sacrificial layers 104 have a vertical thickness ranging, for example, from approximately 3 nm to approximately 20 nm. In certain embodiments, the active semiconductor layers 106 have a vertical thickness ranging, for example, from approximately 3 nm to approximately 10 nm. Although twelve total layers are illustrated, it should be appreciated that the nanosheet stack 103 can include any suitable number of layers. Although the range of 3-20 nm is cited as an example range of thickness, other thickness of these layers may be used. In certain examples, certain of the sacrificial layers 104 or the active semiconductor layers 106 may have different thicknesses relative to one another. For example, as shown in FIG. 1, the third sacrificial layer 104 from the stop of the nanosheet stack 103 has a greater thickness than other of the layers of the stack. Therefore, multiple epitaxial growth processes can be performed to form the alternating sacrificial layers 104 and the active semiconductor layers 106.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the sacrificial layers 104.

Figure 2:
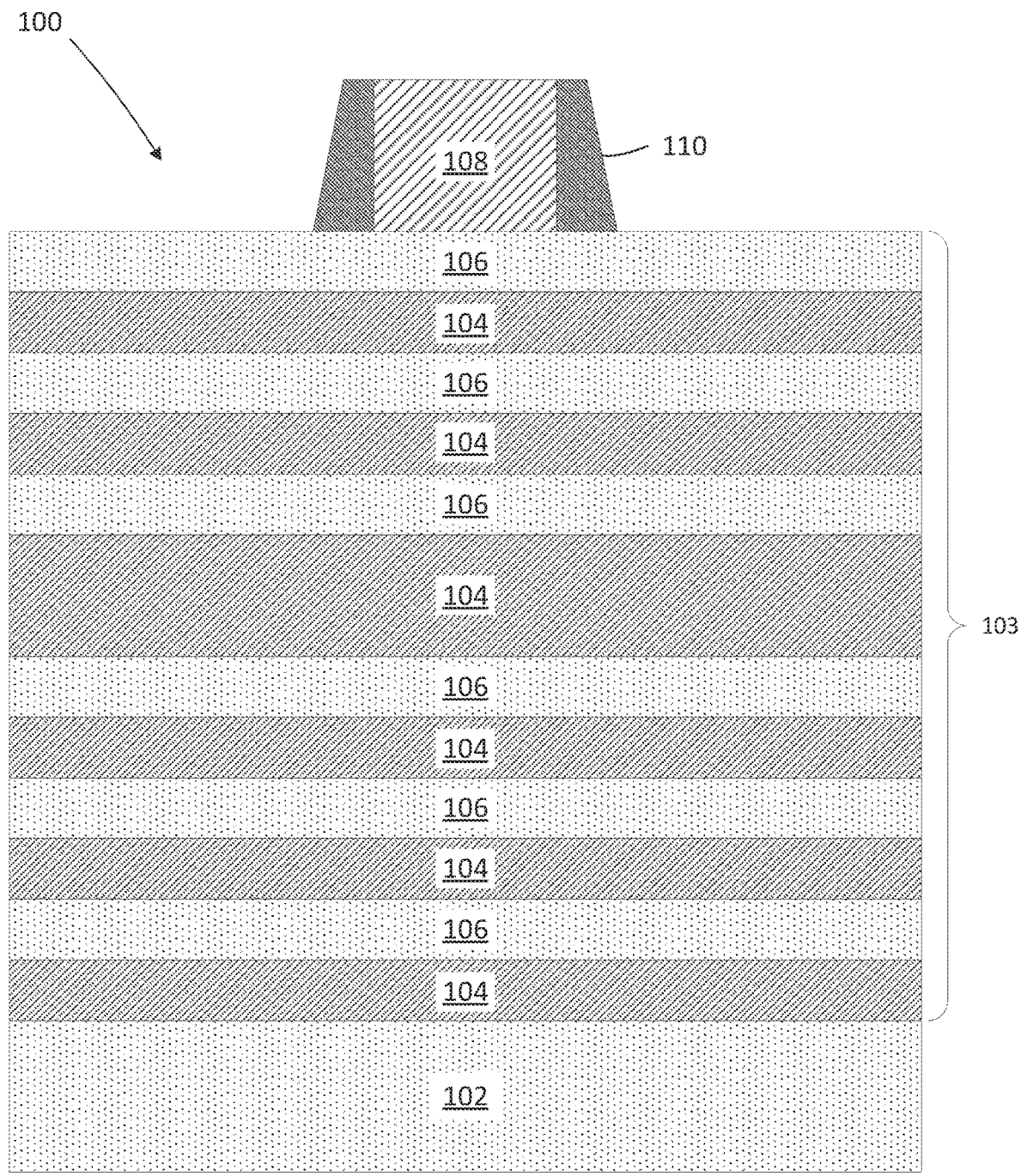
FIG. 2 is a cross-sectional view of the semiconductor nanosheet NCFET device of FIG. 1 after additional fabrication operations, according to embodiments.

Referring now to FIG. 2, a cross-sectional view of the NCFET device 100 of FIG. 1 is shown at a subsequent stage of the manufacturing process, according to embodiments. In FIG. 2, following the formation of the nanosheet stack 103 (e.g., all of the layers of 104 and 106) a dummy gate 108 is formed on the topmost active semiconductor layer 106 by any suitable deposition and/or patterning process. The dummy gate 108 may be formed by any suitable deposition technique known to one of skill in the art. In one example, the dummy gate 108 is formed by depositing a thin $SiO_2$ layer, followed by depositing a layer of amorphous Si (a-Si). A spacer 110 (e.g., a hardmask) is also formed on opposite sides of the dummy gate 108. The spacer 110 is formed for subsequent nanosheet patterning. The spacer 110 can be composed of various nitride materials including, but not limited to, silicon nitride (SiN). In certain embodiments, although not shown in the cross-sectional view of FIG. 2, the dummy gate 108 extends into and out of the page to wrap around the edges of the nanosheet stack 103, and the subsequent removal of the dummy gate 108 (see, FIG. 6) allows an access point for later removal of the sacrificial layers 104.

Figure 3:
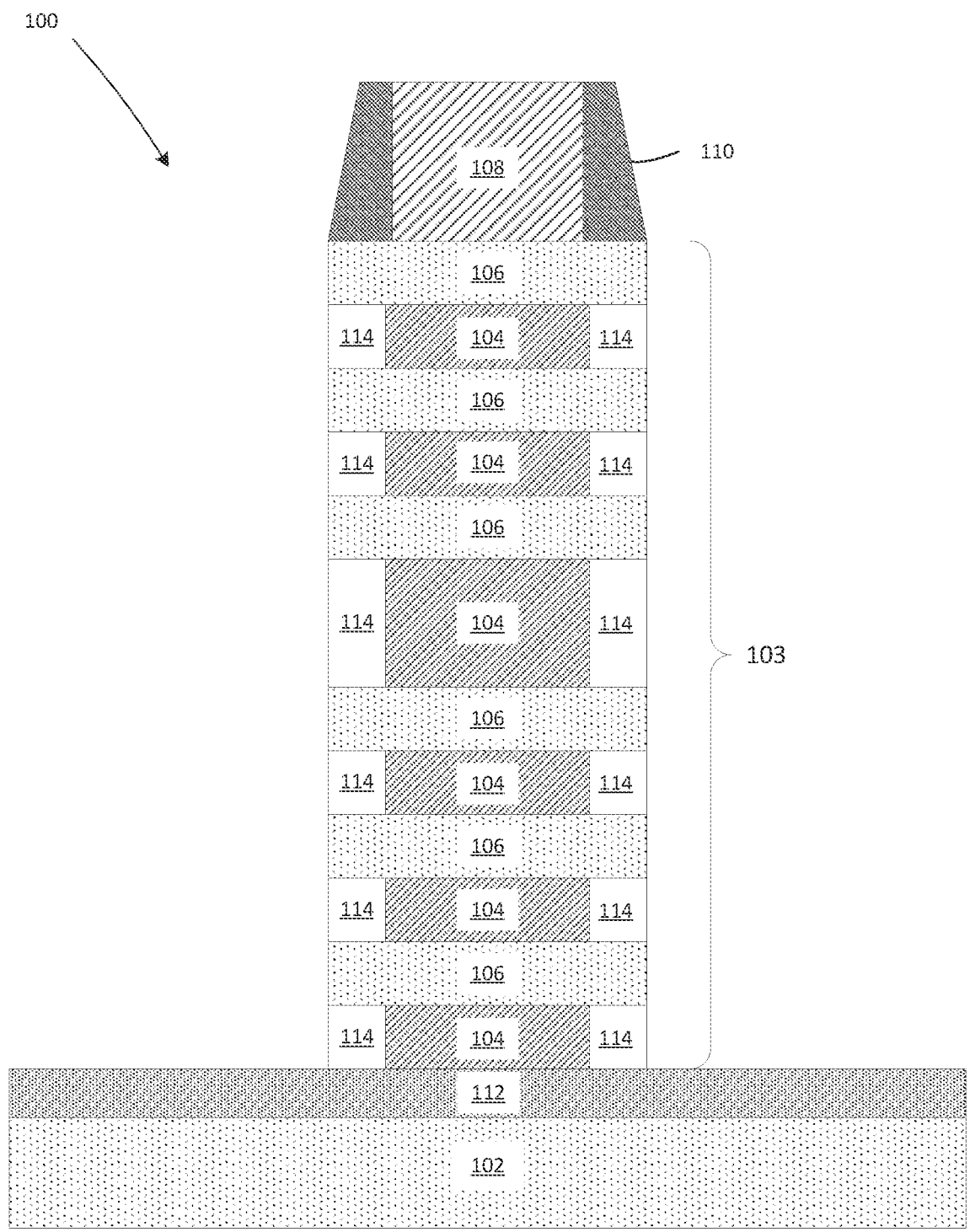
FIG. 3 is a cross-sectional view of the semiconductor nanosheet NCFET device of FIG. 2 after additional fabrication operations, according to embodiments.

Referring now to FIG. 3, a cross-sectional view of the NCFET device 100 of FIG. 2 is shown at a subsequent stage of the manufacturing process, according to embodiments. In FIG. 3, the NCFET device 100 is subjected to a fin etching process to expose portions of the substrate 102. The fin etching process is achieved, for example, using a lithography patterning process (i.e., the formation of the spacer 110) followed by a directional reactive ion etch (RIE) process, which is capable of removing portions of the sacrificial layers 104 and the active semiconductor layers 106 not covered by the dummy gate 108 and the spacer 110. The RIE can use a boron-based chemistry or a chlorine-based chemistry, for example, which selectively recesses the exposed portions sacrificial layers 104 and the active semiconductor layers 106 without attacking the substrate 102. As also shown in FIG. 3, in certain embodiments, a dielectric isolation layer 112 may also be formed between the nanosheet stack 103 and the substrate 102.

As also shown in FIG. 3, portions of the sacrificial layers 104 are recessed in an inward direction so that the processed widths of the sacrificial layers 104 are less than widths of the active semiconductor layers 106. Then, inner spacers 114 are added in the recesses of the sacrificial layers 104. In certain embodiments, after the formation of the inner spacers 114, a directional RIE process can be performed once again using the spacer 110 as a mask to create outer vertical edges to the inner spacers 114 that align with outer vertical edges of the active semiconductor layers 106. In certain embodiments, the material of the inner spacer 114 is a dielectric material such as SiN, SiO, SiBCN, SiOCN, SiCO, etc.

Figure 4:
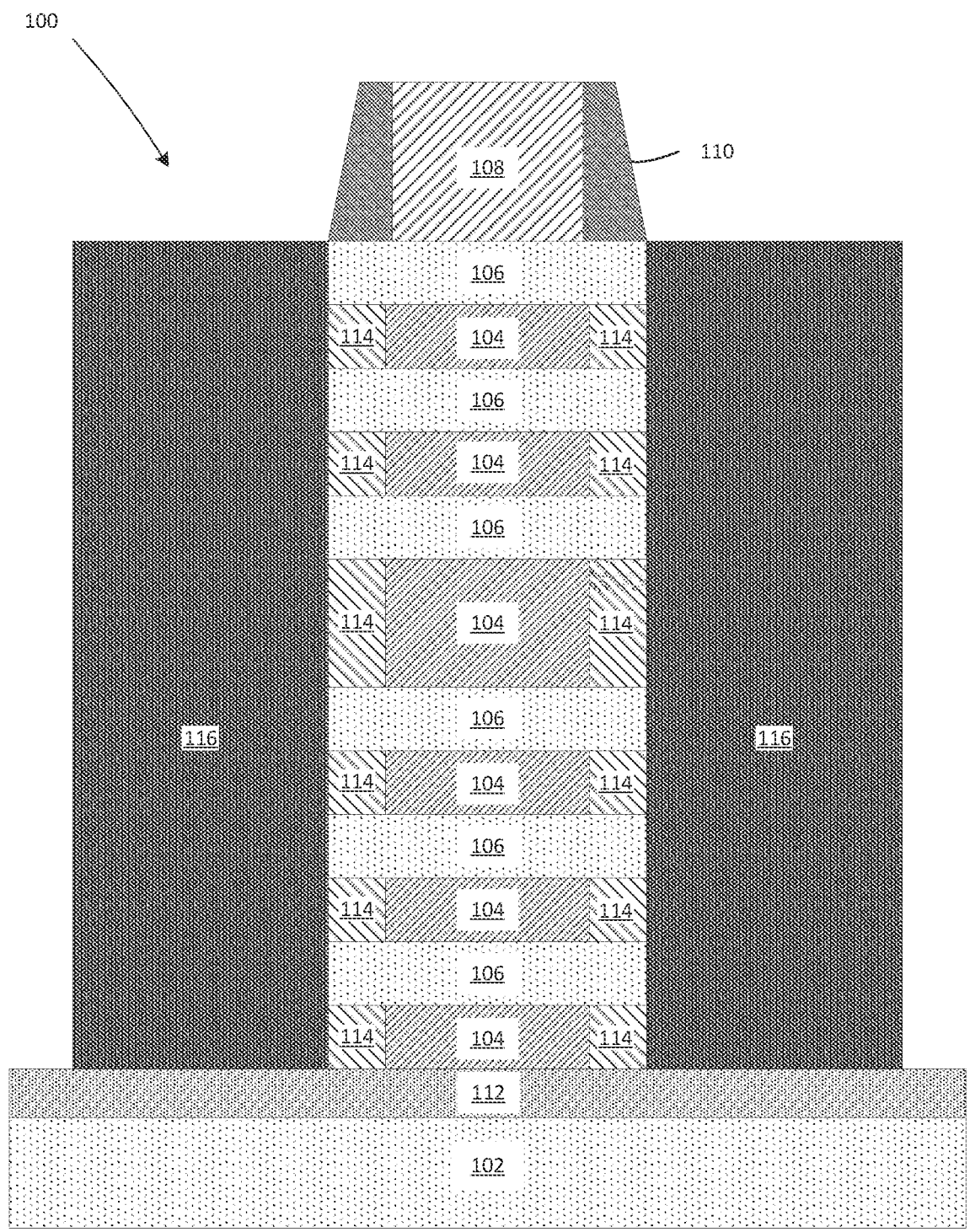
FIG. 4 is a cross-sectional view of the semiconductor nanosheet NCFET device of FIG. 3 after additional fabrication operations, according to embodiments.

Referring now to FIG. 4, a cross-sectional view of the NCFET device 100 of FIG. 3 is shown at a subsequent stage of the manufacturing process, according to embodiments. In FIG. 3, a PFET layer 116 is initially deposited by an epitaxial growth method up to at least the level of the top of the nanosheet stack 103. In certain embodiments, the material of the PFET layer 116 is SiGe53:B. However, it should be appreciated that any other suitable materials may be used.

Figure 5:
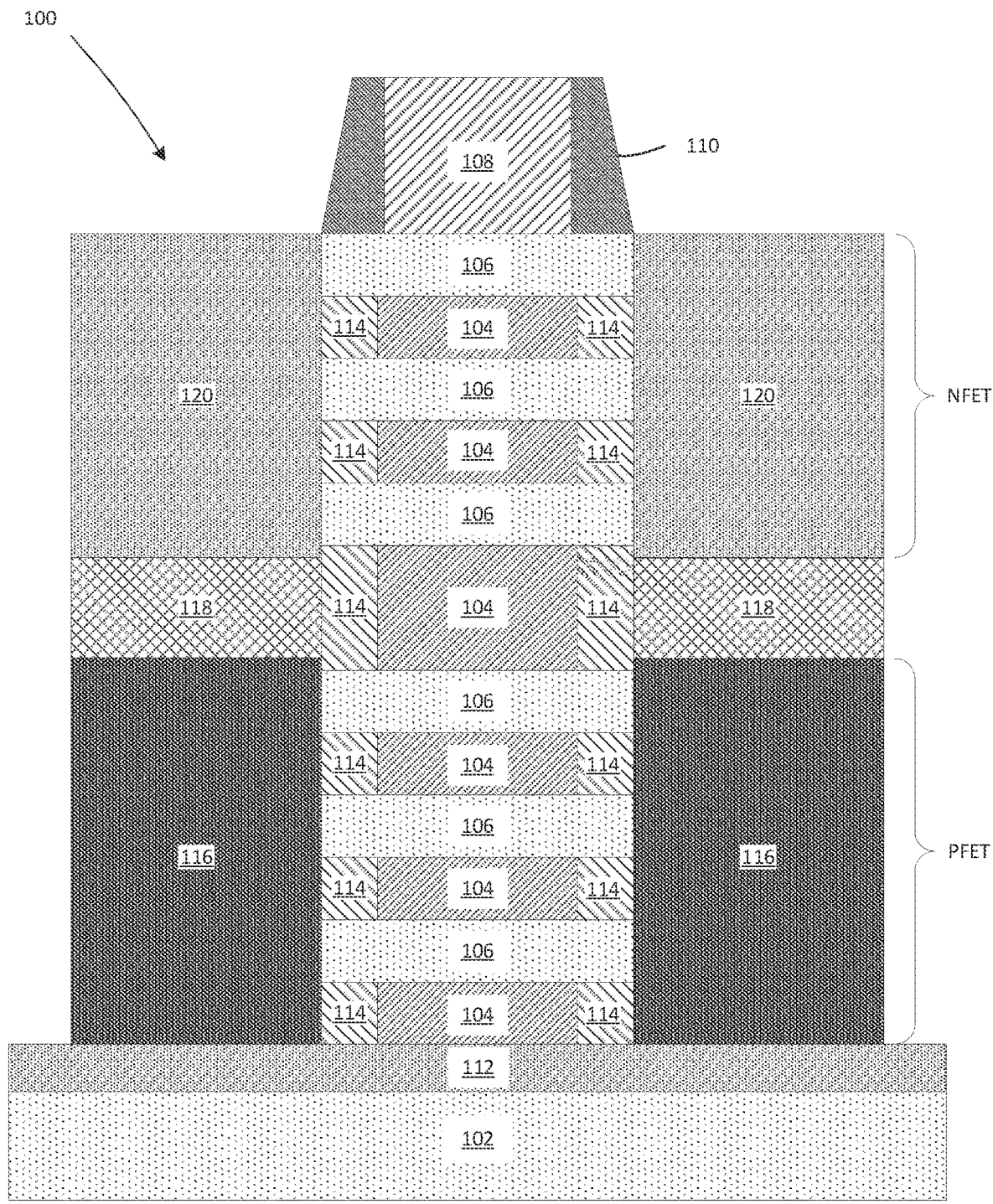
FIG. 5 is a cross-sectional view of the semiconductor nanosheet NCFET device of FIG. 4 after additional fabrication operations, according to embodiments.

Referring now to FIG. 5, a cross-sectional view of the NCFET device 100 of FIG. 4 is shown at a subsequent stage of the manufacturing process, according to embodiments. In FIG. 5, the PFET layer 116 is recessed down to a level about half the way down the nanosheet stack 103 to form a PFET region. Then, an insulating layer 118 is formed on top of the PFET layer 116. Initially, the insulating layer 118 may be formed at a higher level than that shown in FIG. 5, and then it may be recessed back down to the level shown in FIG. 5. The insulating layer 118 may be comprised of $SiO_2$ or any other suitable insulating material. As also shown in FIG. 5, an NFET layer 120 is then formed on the insulating layer 118 by an epitaxial growth method up to a level generally corresponding to the top of the nanosheet stack 103 to form an NFET region. It should be appreciated that although in FIG. 5 the PFET region is shown on the bottom of the nanosheet stack 103 and the NFET region is shown on the top of the nanosheet stack 103, in other embodiments the order of the regions may be reversed (i.e., the NFET region on the bottom and the PFET region on the top).

Figure 6:
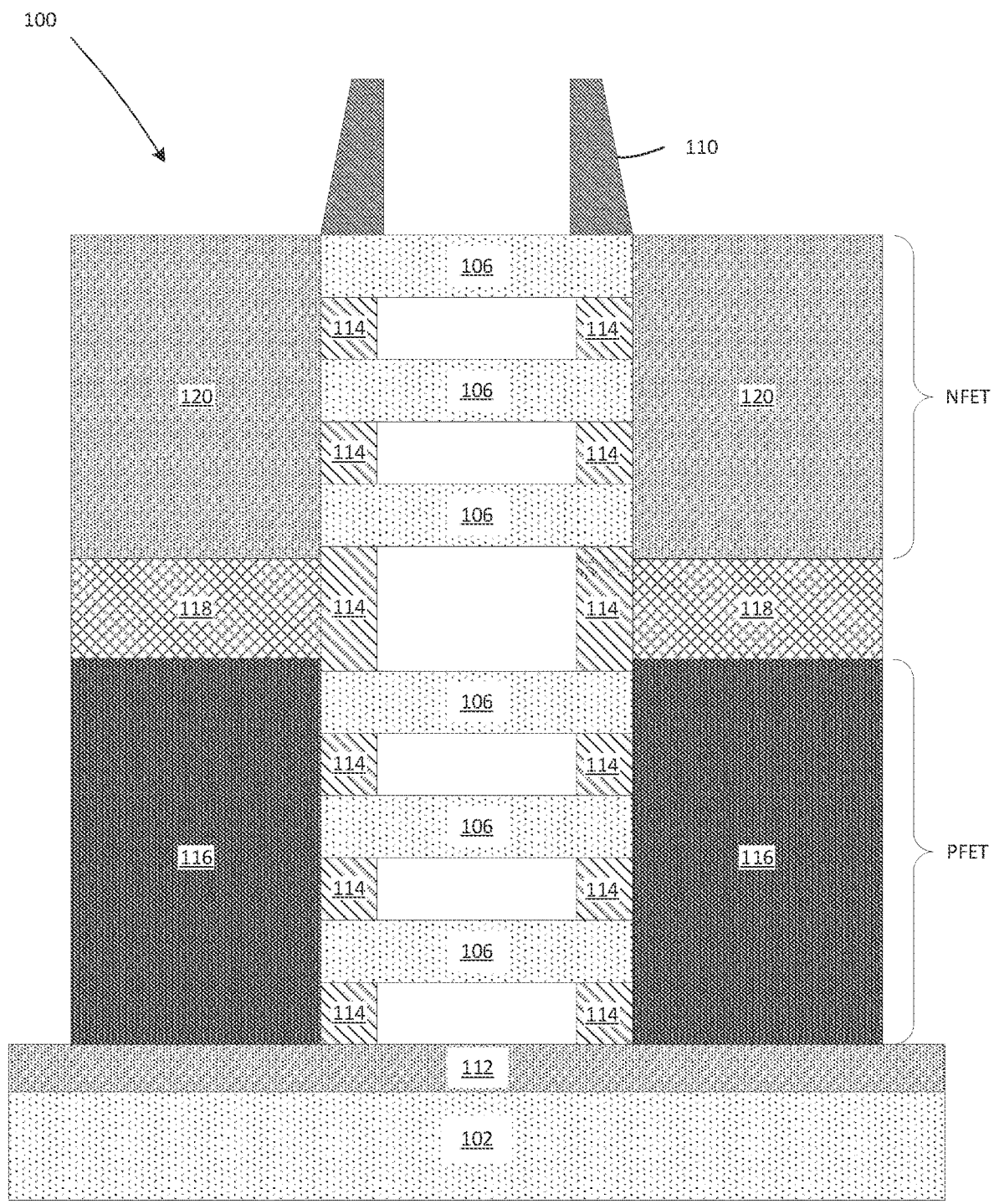
FIG. 6 is a cross-sectional view of the semiconductor nanosheet NCFET device of FIG. 5 after additional fabrication operations, according to embodiments.

Referring now to FIG. 6, a cross-sectional view of the NCFET device 100 of FIG. 5 is shown at a subsequent stage of the manufacturing process, according to embodiments. In FIG. 6, the dummy gate 108 has been removed by any suitable material removal process. Then, the sacrificial layers 104 are removed (or released). Thus, as shown in FIG.

6, there are void spaces between the active semiconductor layers 106 due to the removal of the sacrificial layers 104.

Figure 7:
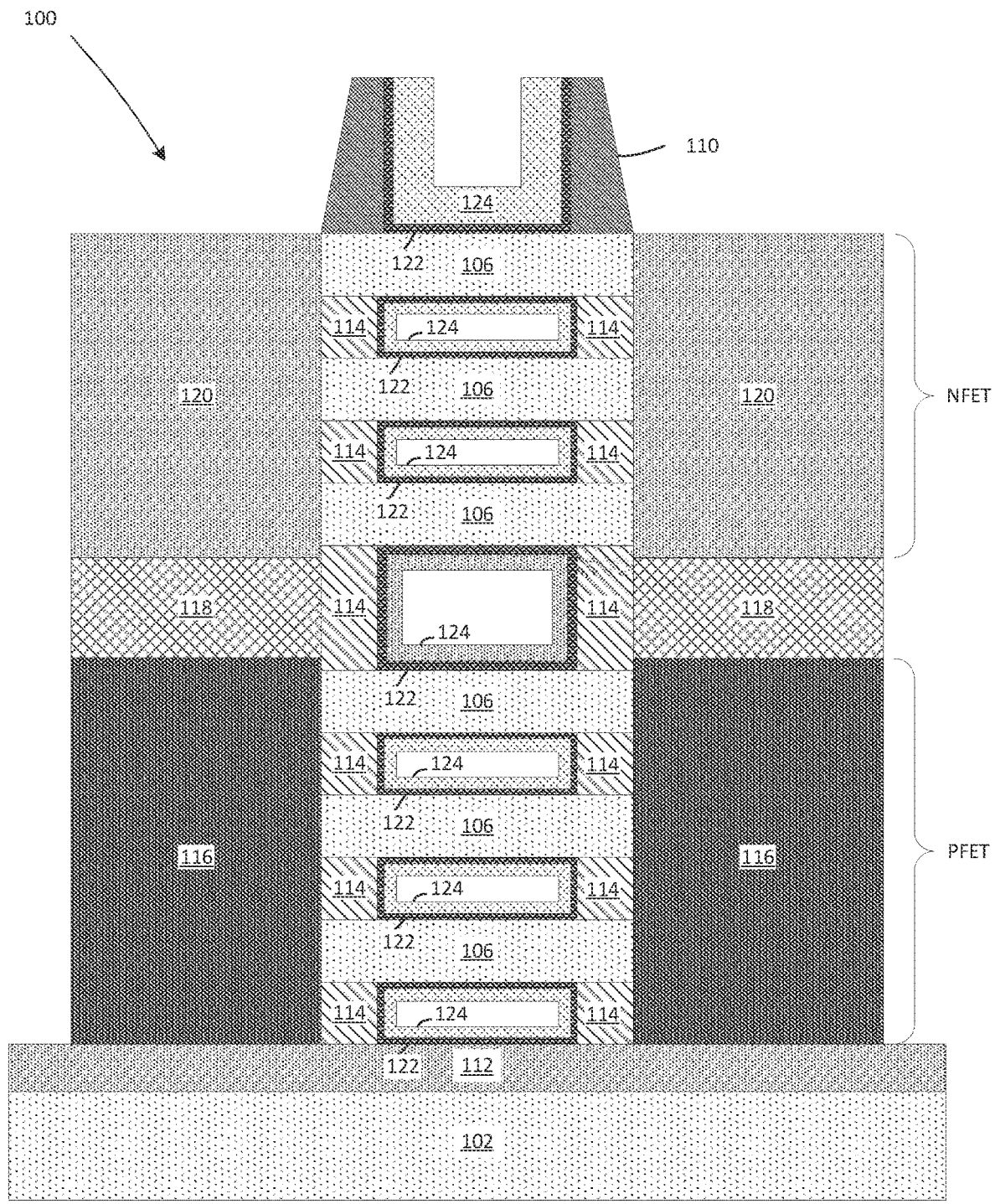
FIG. 7 is a cross-sectional view of the semiconductor nanosheet NCFET device of FIG. 6 after additional fabrication operations, according to embodiments.

Referring now to FIG. 7, a cross-sectional view of the NCFET device 100 of FIG. 6 is shown at a subsequent stage of the manufacturing process, according to embodiments. As shown in FIG. 7, following the removal of the sacrificial layers 104 and the dummy gate 108, an interfacial layer 122 is formed on the interior surfaces of the spacer 110 and the interior surfaces of the active semiconductor layers 106 and the inner spacers 114. Then, a high-κ layer (not shown) is formed to cover all of the surfaces of exposed surfaces of the interfacial layer 122. In FIG. 7, for ease of illustration, the combination of the interfacial layer 122 and the high-κ layer is shown as a single layer.

In certain embodiments, the gate stack (or nanosheet stack 103) generally includes a work function metal (WFM) that sets the threshold voltage (Vt) of the device, a high-κ gate dielectric material (e.g., 122) separating the WFM from the nanosheets, and other metals that may be desired to further fine tune the effective work function (eWF) and/or to achieve a desired resistance value associated with current flow through the gate stack in the direction parallel to the plane of the nanosheets.

As also shown in FIG. 7, a PFET work function metal (pWF) layer 124 is formed on all the interior surfaces of the interfacial layer 122. Initially, the pWF metal layer 124 is formed in both the PFET regions and NFET regions of the nanosheet stack 103. However, as will be described below, the pWF metal layer 124 is later removed in the NFET region. In certain embodiments, the pWF metal layer 124 may be comprised of, for example, TiN formed by an atomic layer deposition (ALD) technique and/or TiN deposited by a chemical vapor deposition (CVD) technique. As described above, in other embodiments, if the NFET region may be on the bottom of the stack, and in that case an nWF metal layer would be deposited first at this stage of the manufacturing process.

Figure 8:
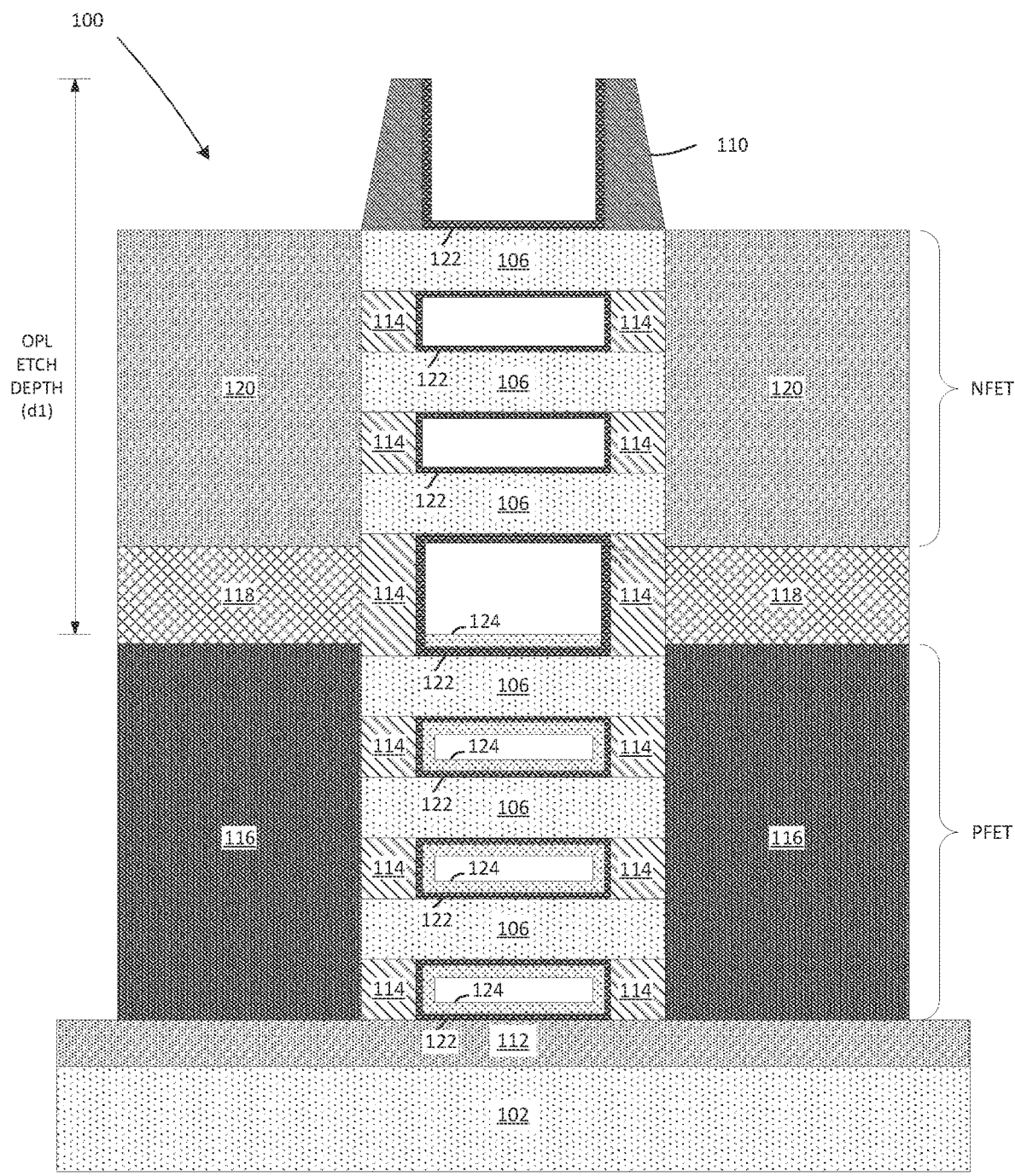
FIG. 8 is a cross-sectional view of the semiconductor nanosheet NCFET device of FIG. 7 after additional fabrication operations, according to embodiments.

Referring now to FIG. 8, a cross-sectional view of the NCFET device 100 of FIG. 7 is shown at a subsequent stage of the manufacturing process, according to embodiments. After the deposition of the pWF metal layer 124, further processing steps may be performed to prepare for the removal of portions of the pWF metal layer 124 down to the level of the N-to-P isolation point, which may be about at the level of the bottom of the insulating layer 118 (or somewhere in the middle of the insulating layer 118). Although not shown in FIG. 8, an organic planarization layer (OPL) is filled in a trench, and then this OPL layer is etched back to a depth d1 shown in FIG. 8. The OPL layer that is etched back to this depth d1 allows for the removal of the pWF metal layer 124 down to a level that generally corresponds to the N-to-P isolation point (i.e., the boundary between the PFET region and the NFET region). As shown in FIG. 8, the pWF metal layer 124 is removed by a wet etching process using SC1 (or any other suitable etching or material removal process) to remove the, for example, TiN material of the pWF metal layer 124 above the depth d1 level. In certain examples, as shown in FIG. 8, a certain amount of pWF metal layer 124 material may remain covering the bottom surface of the interfacial layer 122 at the level of d1. However, in other examples, this portion of the remaining pWF metal layer 124 may also cover at least a portion of sidewall surfaces of the interfacial layer 122 at the N-to-P isolation point. Therefore, the pWF metal layer 124 has been removed in portions of the nanosheet stack 103 corresponding to the NFET region.

Figure 9:
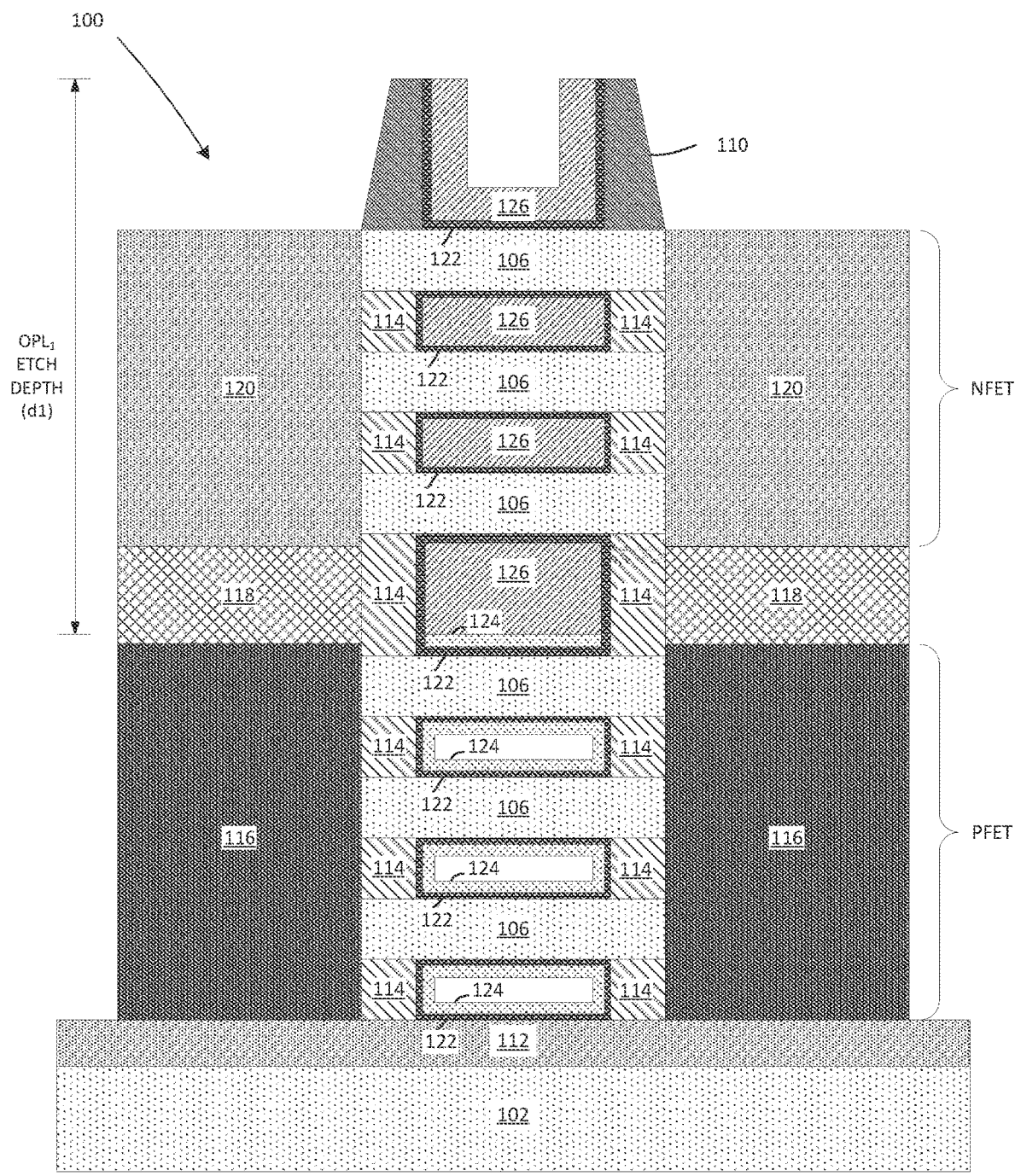
FIG. 9 is a cross-sectional view of the semiconductor nanosheet NCFET device of FIG. 8 after additional fabrication operations, according to embodiments.

Referring now to FIG. 9, a cross-sectional view of the NCFET device 100 of FIG. 8 is shown at a subsequent stage of the manufacturing process, according to embodiments. As shown in FIG. 9, a top portion of a trench (not shown, but corresponding to the depth d1 of the $OPL_1$ etch, or a depth that is somewhere between the NFET region and the PFET region in the vicinity of the insulating layer 118) is filled in with a nWF metal layer 126, thus forming the a nWF metal stack including, for example, a TiN/Al-containing alloy or TiN. Also, the nWF metal layer 126 material that is formed in the space previously occupied by the dummy gate 108 and between the spacer 110. As shown in FIG. 9, this top portion of the nWF metal layer 126 but does not completely fill this space.

Figure 10:
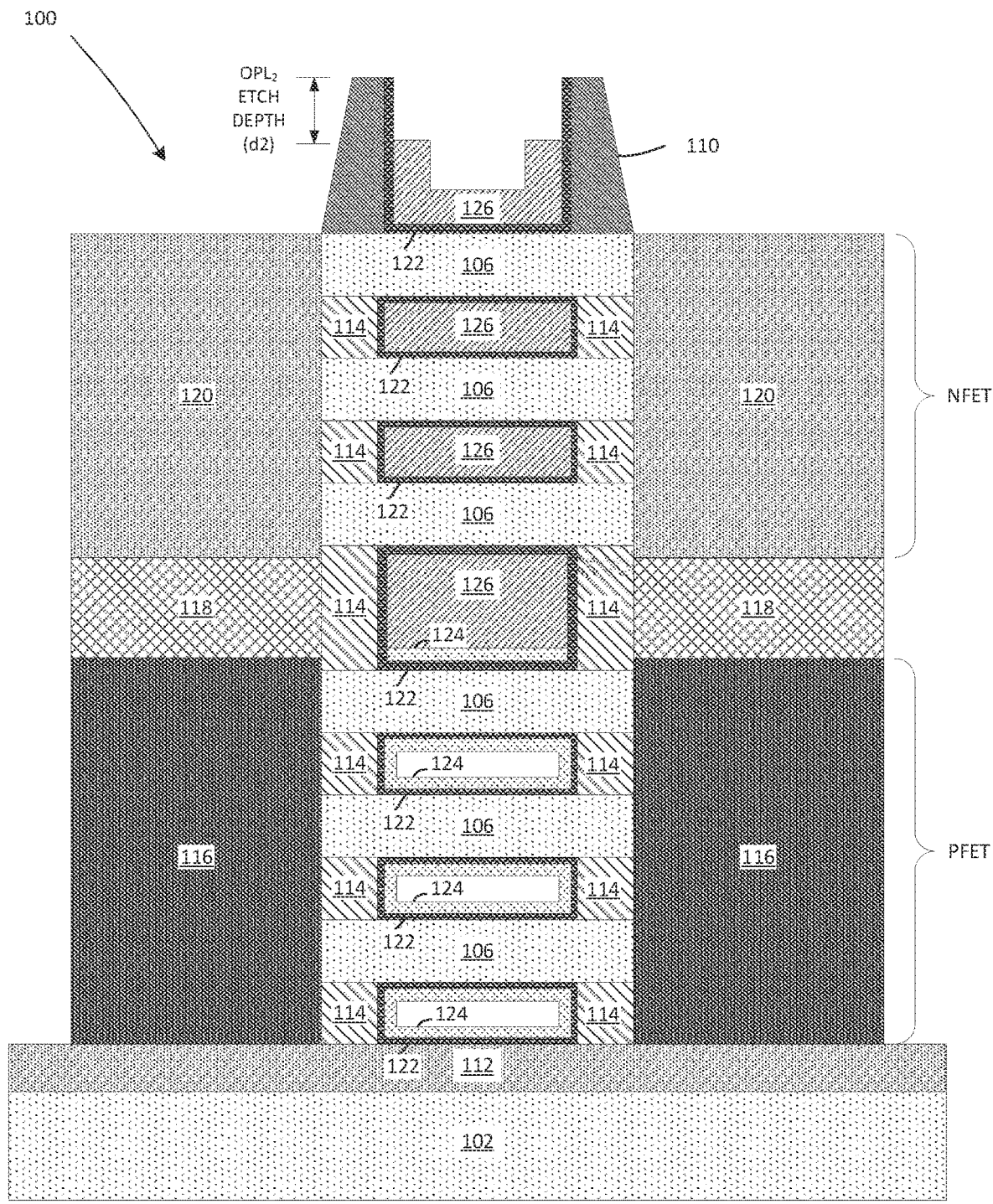
FIG. 10 is a cross-sectional view of the semiconductor nanosheet NCFET device of FIG. 9 after additional fabrication operations, according to embodiments.

Referring now to FIG. 10, a cross-sectional view of the NCFET device 100 of FIG. 9 is shown at a subsequent stage of the manufacturing process, according to embodiments. As shown in FIG. 10, the top portion of the nWF metal layer 126 is recessed using, for example, an OPL fill and etching process. In other words, in a first step, an organic planarization layer (OPL) is initially deposited to fill the remaining spaces in the top portion of the nWF metal layer 126. Then, as a second step, the OPL layer is etched back. In particular, this top portion of the nWF metal layer 126 is recessed down to an $OPL_2$ etch depth of d2.

Figure 11:
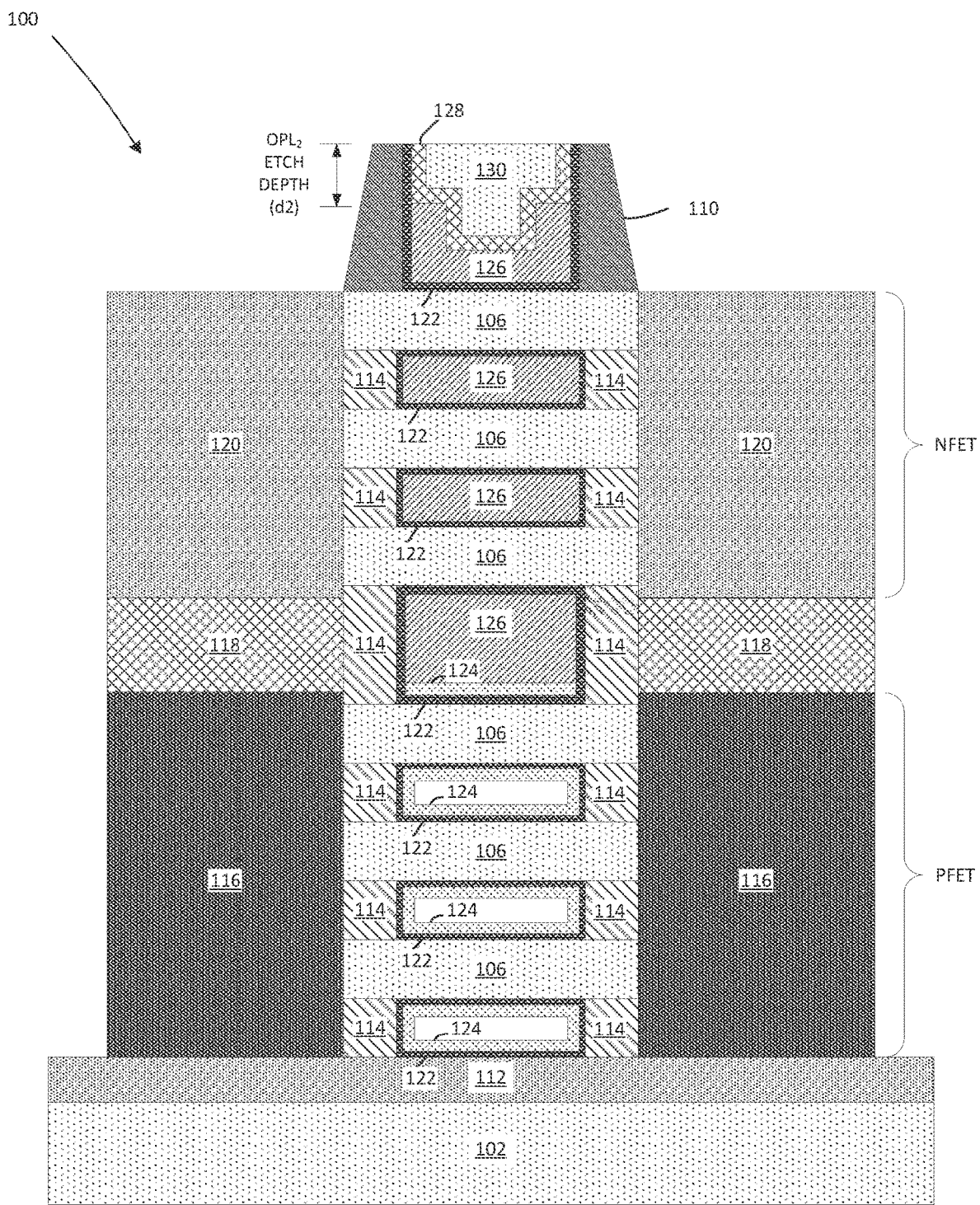
FIG. 11 is a cross-sectional view of the semiconductor nanosheet NCFET device of FIG. 10 after additional fabrication operations, according to embodiments.

Referring now to FIG. 11, a cross-sectional view of the NCFET device 100 of FIG. 10 is shown at a subsequent stage of the manufacturing process, according to embodiments. As shown in FIG. 11, a ferroelectric layer 128 is formed on the exposed upper surfaces of the nWF metal layer 126 that was previously recessed as described with respect to FIG. 10. The ferroelectric layer 128 may be conformally deposited on this entire exposed surfaces, and may be comprised of one or more of HfZrO, HfSiO, HfAlO, $HfO_2$ etc. It should be appreciated that the ferroelectric layer 128 may be comprised of any suitable material or combination of materials. Then, a top electrode 130 (e.g., a gate electrode) is formed in the remaining space above the ferroelectric layer 128. Thus, the ferroelectric layer 128 is formed inside the top electrode 130. A series combination connection between the ferroelectric layer 128 and a dielectric layer (i.e., the high-κ layer that is part of the interfacial layer 122) is how the negative capacitance behavior of the NCFET device 100 is achieved. To achieve this, in certain embodiments as discussed in detail above, the nWF metal layer 126 is not modified, but the dielectric interfacial layer 122 is modified using oxygen vacancies so that the threshold voltage can be tuned to achieve a low Vt pair. In this regard, in certain embodiments, the Vt is set by metal induced oxygen vacancy creation in the dielectric interfacial layer 122 rather than in the work function setting metals themselves (e.g., an Al containing alloy for the NFET, and TiN for the PFET). In the present embodiments, the top portion of the replacement metal gate (RMG) stack is recessed and a metal-ferroelectric-metal (MFM) stack (i.e., the top portion of the nWF metal layer 126, the ferroelectric layer 128 and the top electrode 130) is formed in the cavity. In certain embodiments, this structure (i.e., including the oxygen vacancies in the dielectric interfacial layer 122) enables a steep SS with the CCM and low Vt FET pairs.

Figure 12:
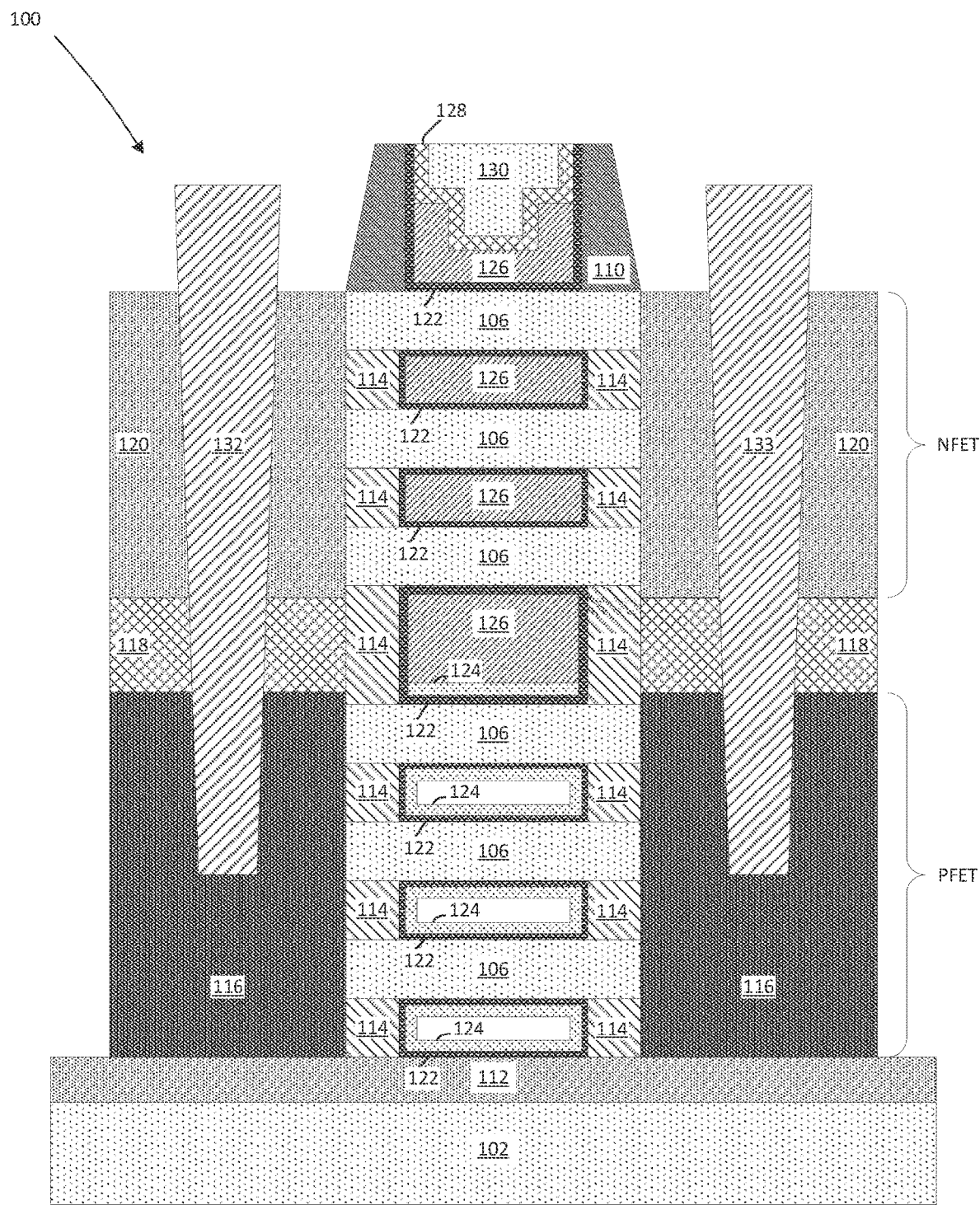
FIG. 12 is a cross-sectional view of the semiconductor nanosheet NCFET device of FIG. 11 after additional fabrication operations, according to embodiments.

Referring now to FIG. 12, a cross-sectional view of the NCFET device 100 of FIG. 11 is shown at a subsequent stage of the manufacturing process, according to embodiments. As shown in FIG. 12, a shared source contact is formed by first etching away material on the right and left sides of the nanosheet stack 103 down to a level corresponding to the PFET region. Then the left side of the etched region is filled in with a conductive metal to form the shared source contact 132. This conductive metal is also filled in the right side of the etched region for form a contact 133.

Figure 13:
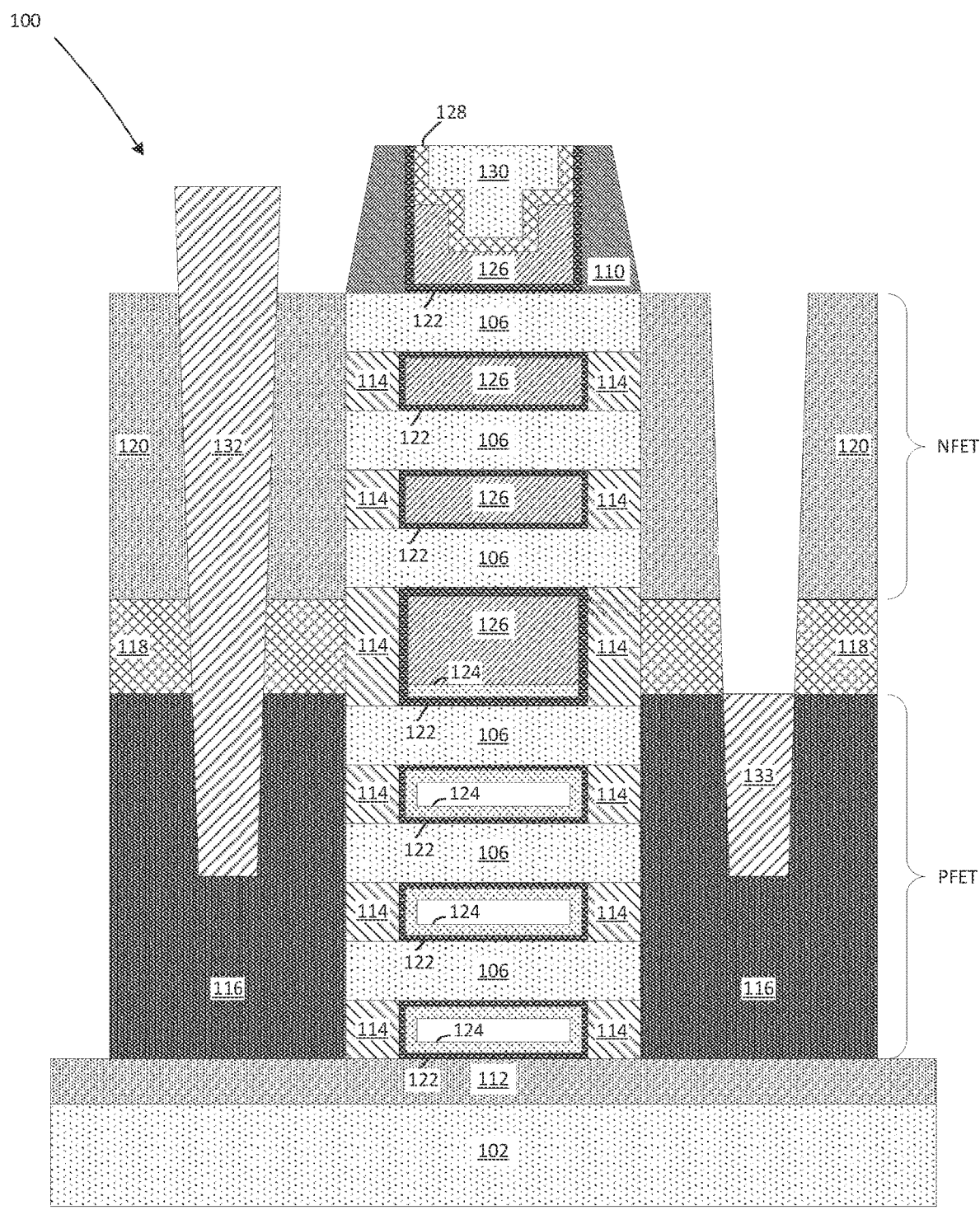
FIG. 13 is a cross-sectional view of the semiconductor nanosheet NCFET device of FIG. 12 after additional fabrication operations, according to embodiments.

Referring now to FIG. 13, a cross-sectional view of the NCFET device 100 of FIG. 12 is shown at a subsequent stage of the manufacturing process, according to embodiments. As shown in FIG. 13, the contact 133 on the right side of the nanosheet stack 103 is etched back to a depth roughly corresponding to the bottom the insulating layer 118. During this step, the shared source contact 132 is not etched back.

Referring now to FIG. 14, a cross-sectional view of the NCFET device 100 of FIG. 13 is shown at a subsequent stage of the manufacturing process, according to embodiments. As shown in FIG. 14, additional insulating layer material 118' is deposited on top of the contact 133, and then a drain contact 134 is formed on the top of the additional insulating layer material 118'.

Figure 15:
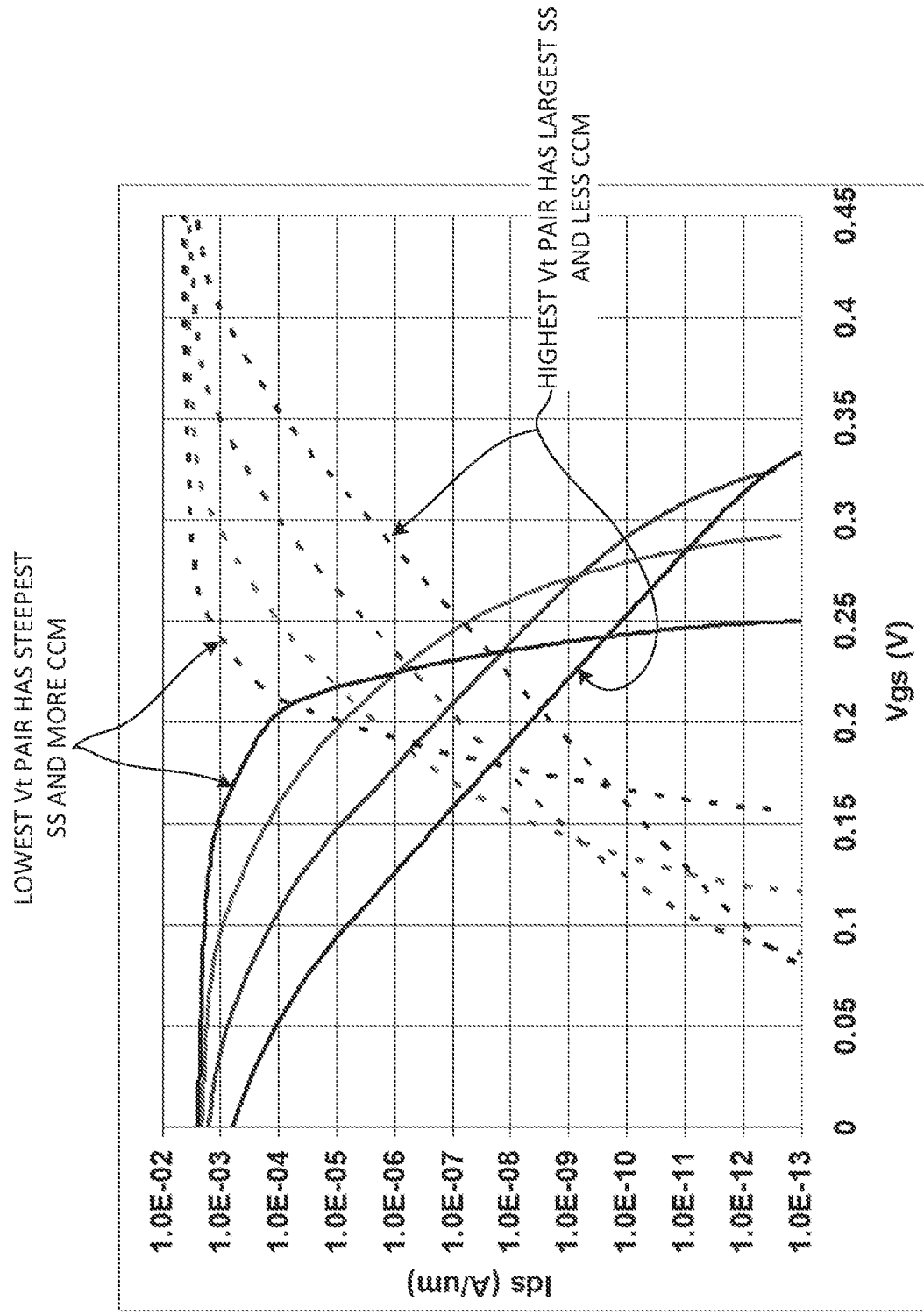
FIG. 15 is a chart of an example NCFET device that illustrates the effects of the sweep (SS) and the complimentary capacitance matching (CCM) for example NCFET devices, according to embodiments.

Referring now to FIG. 15, a chart of an example NCFET device is shown that illustrates the effects of the sweep (SS) and the complimentary capacitance matching (CCM) concepts. In FIG. 15, the lines represent an example device a highest Vt pair has less SS slope (i.e., less steep slope) and worse CCM. However, according to the present embodiments, an NCFET device may achieve a lowest Vt pair (i.e., indicated by the lines marked as lowest Vt pair) which has the steepest SS slope and improved CCM by including a dielectric interfacial layer having metal induced oxygen vacancies (i.e., rather than in the metal work function layer itself). Thus, a structure may be provided with steep swing (SS), with improved complementary capacitance matching, and with low Vt FET pairs. Moreover, such devices may be provided with a footprint area of only one FET due to the vertical stacking of the n-type and p-type nanosheets. Thus, the stacked configuration of PFET on NFET of the present embodiments is able to achieve an improvement in device performance without the footprint (layout area) penalties that it would typically take to make a transistor switch more steeply.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a negative capacitance field effect transistor (NCFET) device, the method comprising:
    forming a transistor stack structure including a first FET and a second FET, where the first FET is stacked on top of the second FET;
    forming a dielectric interfacial layer on the transistor stack structure, the dielectric interfacial layer including metal induced oxygen vacancies and is formed on a portion of the transistor stack structure; and
    forming a metal-ferroelectric-metal (MFM) structure on the dielectric interfacial layer, the MFM structure including a work function metal layer on the dielectric interfacial layer, a ferroelectric layer on the work function metal layer, and a top electrode on the ferroelectric layer.

2. The method according to claim 1, wherein the NCFET device includes a shared internal gate between the first FET and the second FET.

3. The method according to claim 1, wherein the NCFET device has a complimentary logic circuit.

4. The method according to claim 1, wherein the ferroelectric layer comprises $HfO_2$ and is formed in a recess of the work function metal layer.

5. The method according to claim 1, further comprising forming an insulating layer between the first FET and the second FET.

6. The method according to claim 1,
    wherein the first FET is a PFET including a pWF metal layer stack and the second FET is an NFET including an nWF metal layer stack, and
    wherein a portion of the pWF metal layer stack contacts the nWF metal layer stack at a boundary between the PFET region and the NFET region.

7. The method according to claim 1, wherein the first FET is a PFET including a pWF metal layer stack and the second FET is an NFET including an nWF metal layer stack, and
    wherein the pWF metal layer stack is formed on top of the nWF metal layer stack.

8. The method according to claim 1, wherein the first FET is a PFET including a pWF metal layer stack and the second FET is an NFET including an nWF metal layer stack, and
    wherein the nWF metal layer stack is formed on top of the pWF metal layer stack.

9. The method according to claim 1, wherein the dielectric interfacial layer directly contacts the first FET.

10. The method according to claim 1, wherein the dielectric interfacial layer directly contacts the second FET.

11. A negative capacitance field effect transistor (NCFET) device comprising:
    a substrate;
    a transistor stack structure formed on the substrate, the transistor stack structure including a first FET and a second FET, where the first FET is stacked on top of the second FET;
    a dielectric interfacial layer formed on the transistor stack structure, the dielectric interfacial layer including metal induced oxygen vacancies, and the dielectric interfacial layer formed on a portion of the transistor stack structure; and
    a metal-ferroelectric-metal (MFM) structure formed on the dielectric interfacial layer, the MFM structure including a work function metal layer on the dielectric interfacial layer, a ferroelectric layer on the work function metal layer, and a top electrode on the ferroelectric layer.

12. The NCFET device according to claim 11, wherein the NCFET device includes a shared internal gate between the first FET and the second FET.

13. The NCFET device according to claim 11, wherein the NCFET device has a complimentary logic circuit.

14. The NCFET device according to claim 11, wherein the ferroelectric layer comprises $HfO_2$ and is formed in a recess of the work function metal layer.

15. The NCFET device according to claim 11, further comprising an insulating layer between the first FET and the second FET.

16. The NCFET device according to claim 11, wherein the first FET is a PFET region including a pWF metal layer stack and the second FET is an NFET region including an nWF metal layer stack, and wherein a portion of the pWF metal layer stack contacts the nWF metal layer stack at a boundary between the PFET region and the NFET region.

17. The NCFET device according to claim 11, wherein the first FET is a PFET including a pWF metal layer stack and the second FET is an NFET region including an nWF metal layer stack, and wherein the pWF metal layer stack is formed on top of the nWF metal layer stack.

18. The NCFET device according to claim 11, wherein the first FET is a PFET including a pWF metal layer stack and the second FET is an NFET region including an nWF metal layer stack, and wherein the nWF metal layer stack is formed on top of the pWF metal layer stack.

19. The NCFET device according to claim 11, wherein the dielectric interfacial layer directly contacts the first FET.

20. The NCFET device according to claim 11, wherein the dielectric interfacial layer directly contacts the second FET.

* * * * *